United States Patent
Baba

(10) Patent No.: US 10,831,098 B2
(45) Date of Patent: Nov. 10, 2020

(54) IMPRINT APPARATUS AND METHOD OF MANUFACTURING ARTICLE

(71) Applicant: CANON KABUSHIKI KAISHA, Tokyo (JP)

(72) Inventor: Norikazu Baba, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 221 days.

(21) Appl. No.: 16/004,797

(22) Filed: Jun. 11, 2018

(65) Prior Publication Data

US 2018/0364565 A1  Dec. 20, 2018

(30) Foreign Application Priority Data

Jun. 15, 2017  (JP) .................................. 2017-117887

(51) Int. Cl.
*B29C 59/00* (2006.01)
*B29C 59/02* (2006.01)
*G03F 7/00* (2006.01)

(52) U.S. Cl.
CPC .......... *G03F 7/0002* (2013.01); *B29C 59/002* (2013.01); *B29C 59/02* (2013.01)

(58) Field of Classification Search
None
See application file for complete search history.

(56) References Cited

U.S. PATENT DOCUMENTS

| 2015/0076724 A1* | 3/2015 | Sato ...................... G03F 7/0002 264/40.1 |
| 2016/0016354 A1 | 1/2016 | Sakamoto et al. |
| 2016/0354969 A1 | 12/2016 | Baba et al. |

FOREIGN PATENT DOCUMENTS

| JP | 2015056589 A | 3/2015 |
| JP | 2016025126 A | 2/2016 |
| JP | 2016225542 A | 12/2016 |

* cited by examiner

*Primary Examiner* — Peter L Vajda
*Assistant Examiner* — Paul Spiel
(74) *Attorney, Agent, or Firm* — Rossi, Kimms & McDowell LLP

(57) ABSTRACT

The present invention provides an imprint apparatus which forms a pattern of an imprint material on a substrate using a mold, the apparatus comprising: a deformation device configured to deform the mold to a convex shape; a detector configured to detect interference fringes for light reflected from the mold and light reflected from the substrate; and a controller configured to control the deformation device to deform the mold to the convex shape, and control a pressing process so that a contact area between the mold and the imprint material on the substrate gradually increases, wherein the controller, in the pressing process, estimates an error for a pressing direction between the mold and the imprint material based on the interference fringes detected by the detector, and corrects the pressing direction so that the error is reduced.

13 Claims, 9 Drawing Sheets

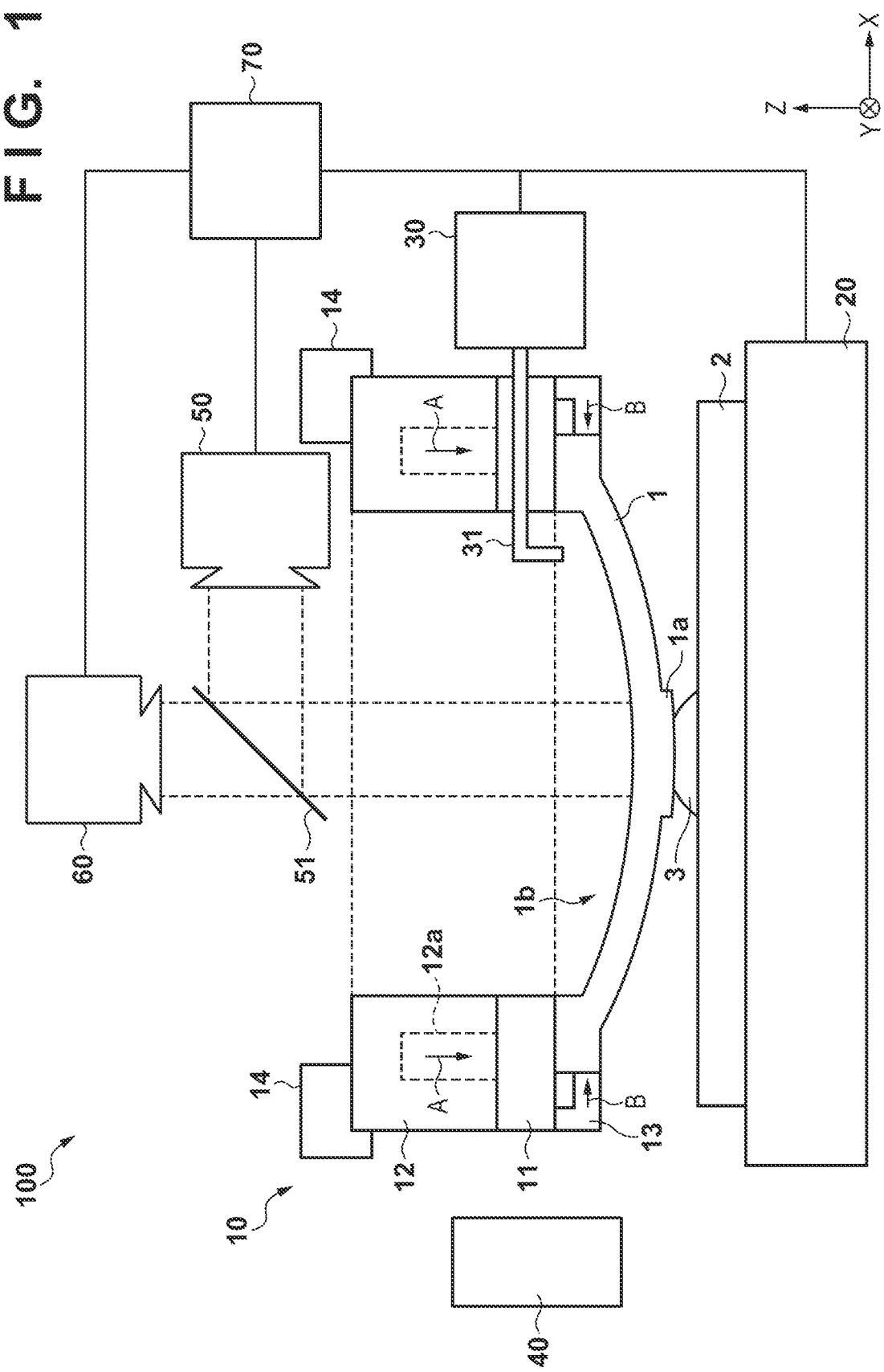

LIGHT INTENSITY DISTRIBUTION

INTERVAL BETWEEN MOLD AND SUBSTRATE

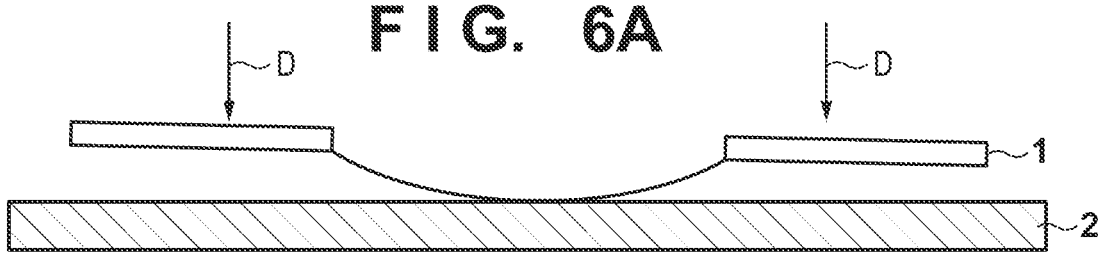
FIG. 6A
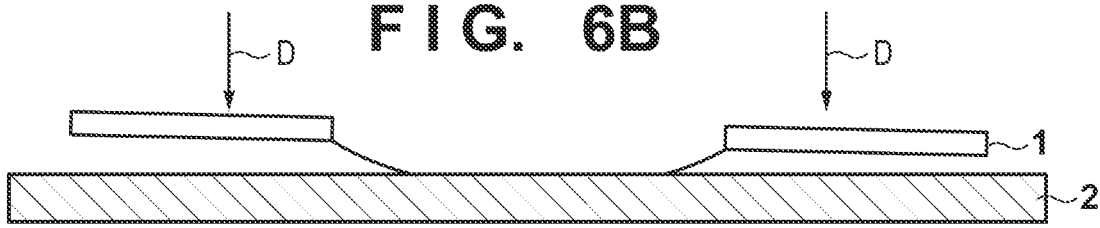
FIG. 6B
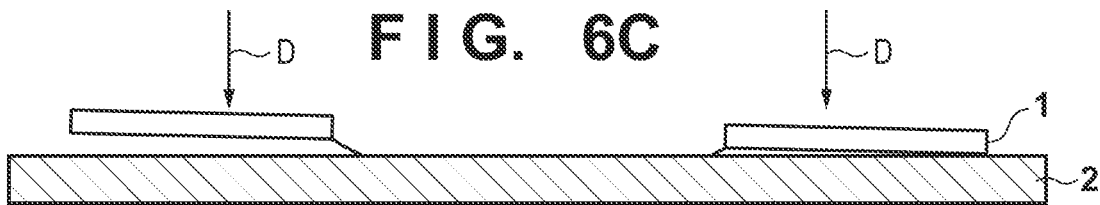
FIG. 6C
FIG. 6D
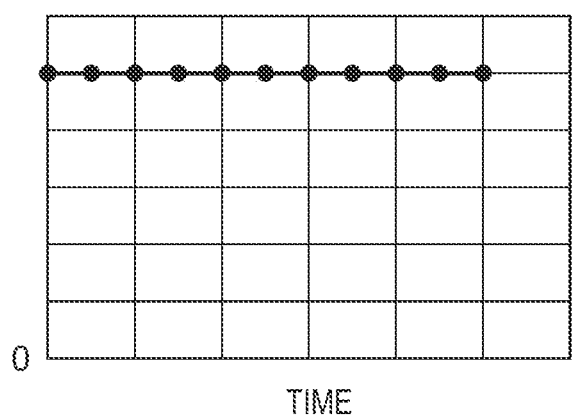
FIG. 6E
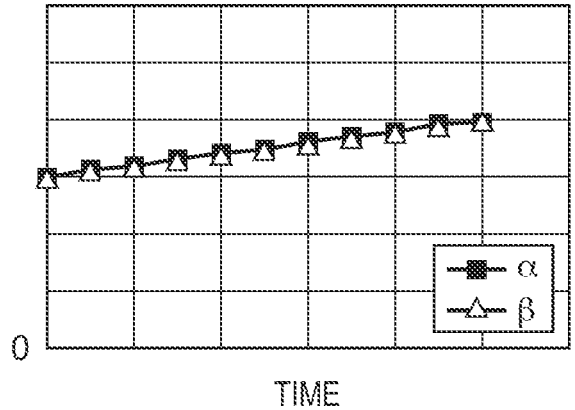

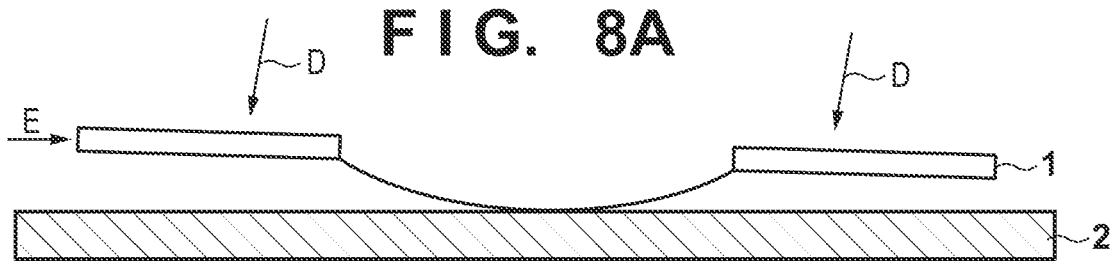
FIG. 8A
FIG. 8B
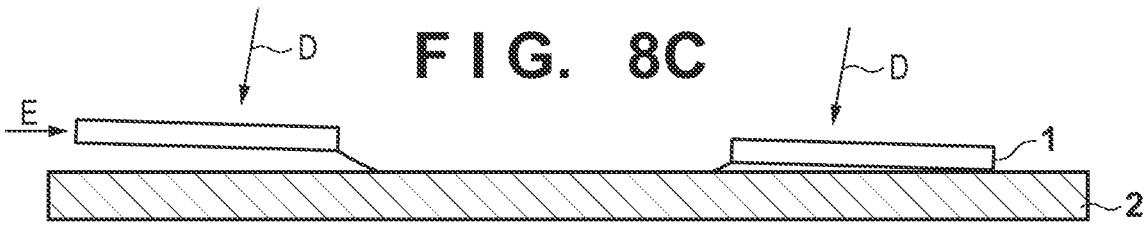
FIG. 8C
FIG. 8D
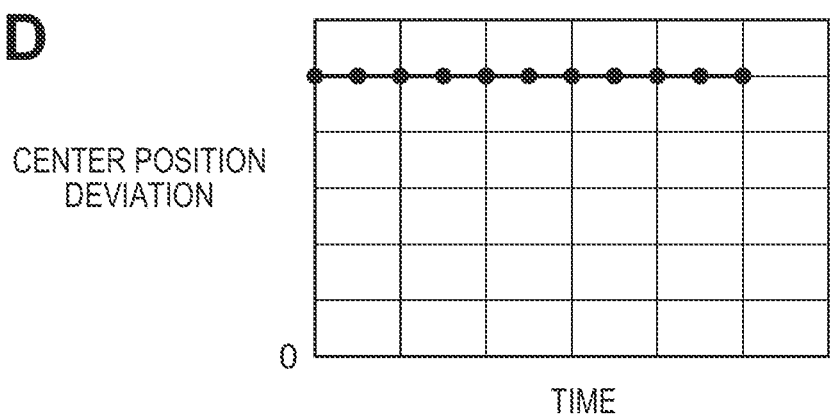
FIG. 8E
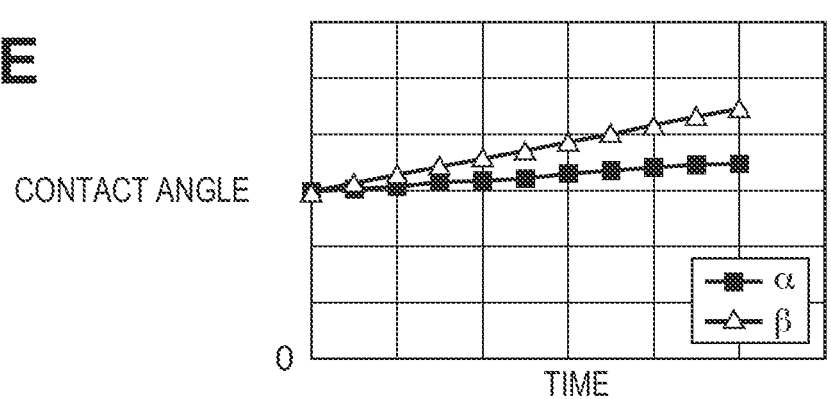

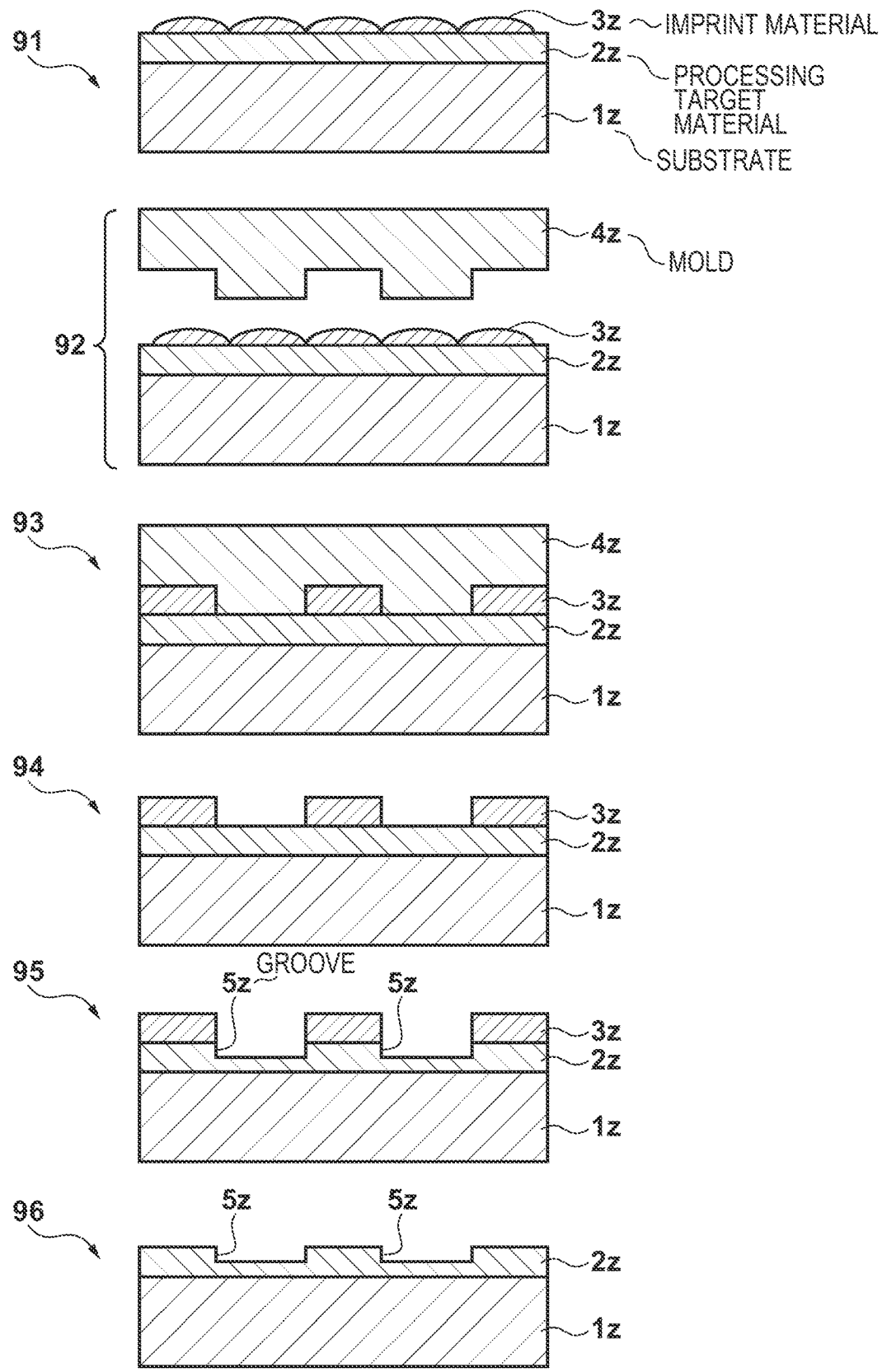

IMPRINT APPARATUS AND METHOD OF MANUFACTURING ARTICLE

BACKGROUND OF THE INVENTION

Field of the Invention

The present invention relates to an imprint apparatus, and a method of manufacturing an article.

Description of the Related Art

An imprint apparatus that forms a pattern of an imprint material on a substrate using a mold having a concave-convex pattern is getting attention as a mass-lithography apparatus for semiconductor devices or the like. In an imprint apparatus, in a case where air bubbles remain in the pattern of a mold when the mold and an imprint material on a substrate are in contact with each other, a defect can arise in the pattern of the imprint material formed on the substrate. Accordingly, the mold (pattern region) is deformed to a convex shape where a central portion of the mold is protruding toward the substrate, and a contact area between the imprint material on the substrate and the mold is gradually increased while deformation of the mold is controlled. Consequently, it is possible to decrease air bubbles remaining in the pattern of a mold pattern.

In such an imprint apparatus, a contact state when increasing a contact area between the mold and the imprint material on the substrate can provide an influence on the quality of the pattern of the imprint material formed on the substrate. Japanese Patent Laid-Open No. 2015-56589 discloses a method of controlling a relative tilt between a substrate and a mold based on a detection result of detecting a contact state between the mold and an imprint material by a detector.

In an imprint apparatus, there are cases where a direction in which a mold and an imprint material on a substrate are brought into contact with each other, in other words a pressing direction between the mold and the imprint material, deviates from a target direction (for example, a direction orthogonal to a surface of the substrate). In such a case, the pattern of the mold distorts due to the viscosity of the imprint material, so it is difficult to accurately form the pattern of the mold on the substrate.

SUMMARY OF THE INVENTION

The present invention provides, for example, an imprint apparatus advantageous in accurately form a pattern of an imprint material on a substrate.

According to one aspect of the present invention, there is provided an imprint apparatus which forms a pattern of an imprint material on a substrate using a mold, the apparatus comprising: a deformation device configured to deform the mold to a convex shape where a central portion of the mold protrudes towards the substrate; a detector configured to irradiate light onto the substrate through the mold, and detect interference fringes for light reflected from the mold and light reflected from the substrate; and a controller configured to control the deformation device to deform the mold to the convex shape, and control a pressing process for pressing the mold and the imprint material against each other so that a contact area between the mold and the imprint material on the substrate gradually increases, wherein the controller, in the pressing process, estimates an error for a pressing direction between the mold and the imprint material based on the interference fringes detected by the detector, and corrects the pressing direction so that the error is reduced.

Further features of the present invention will become apparent from the following description of exemplary embodiments with reference to the attached drawings.

BRIEF DESCRIPTION OF THE DRAWINGS

FIG. 1 is a schematic view for illustrating a configuration of an imprint apparatus.

FIGS. 6A to 6E are views for describing a contact state between an imprint material on a substrate and a mold, in a pressing process.

FIGS. 8A to 8E are views for describing a contact state between an imprint material on a substrate and a mold, in a pressing process.

FIG. 9 is a view for illustrating a method of manufacturing an article.

DESCRIPTION OF THE EMBODIMENTS

Figure 2A:
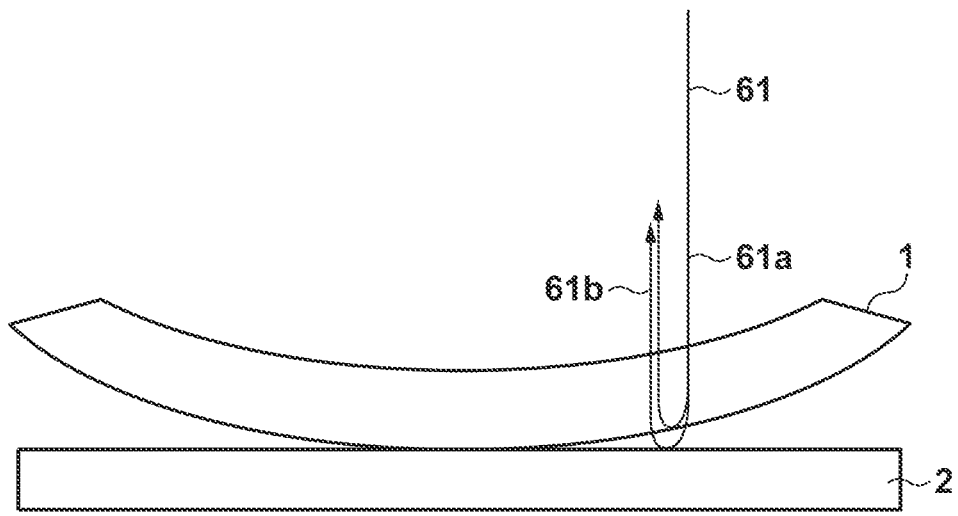
FIGS. 2A through 2B are views for illustrating images obtained by a detector.

Exemplary embodiments of the present invention will be described below with reference to the accompanying drawings. Note that the same reference numerals denote the same members throughout the drawings, and a repetitive description thereof will not be given. Directions parallel to the surface of a substrate (directions along a surface of the substrate) are given as an X direction and a Y direction, and a direction orthogonal to the surface of the substrate (a direction along an optical axis of light incident on the substrate) is given as a Z direction.

First Embodiment

An imprint apparatus 100 of a first embodiment according to the present invention will be described. The imprint apparatus 100 is an apparatus for forming a pattern of a cured material to which a concave-convex pattern of a mold has been transferred, by bringing the mold and an imprint material supplied onto a substrate into contact with each other, and applying the curing energy to the imprint material. For example, the imprint apparatus 100 supplies an imprint material 3 onto a substrate, and cures the imprint material 3 in a state where a mold 1 on which a concave-convex pattern is formed is brought into contact with the imprint material 3 on the substrate. By increasing an interval between a mold 1 and a substrate 2 to separate (release) the mold 1 from the cured imprint material 3, the pattern of the imprint material 3 is formed on the substrate. There are cases where a series of processes performed by the imprint apparatus 100 in this fashion is referred to as an "imprint process" below.

For the imprint material 3, a curable composition (also referred to as a resin in an uncured state) that cures by being provided with energy for curing is used. An electromagnetic wave, heat, or the like is used as the energy for curing. The electromagnetic wave is light such as infrared light, visible light, and ultraviolet light whose wavelength is selected from a range of greater than or equal to 10 nm and less than or equal to 1 mm, for example.

The curable composition is a composition that cures in accordance with being heated or by irradiation of light. Out of these, a photo-curable composition that cures in accordance with light contains at least a polymerizable compound and a photopolymerization initiator, and may contain a solvent or a non-polymerizable compound as necessary. A non-polymerizable compound is at least one type selected from a group of a sensitizer, a hydrogen donor, an internal mold release agent, a surfactant, an antioxidant, a polymeric component, or the like.

The imprint material 3 is applied as a film onto the substrate by a spin coater or a slit coater. Alternatively, it may be applied onto the substrate in a droplet shape, as a film or in an island form achieved by a plurality of droplets connecting, in accordance with a liquid ejection head. A viscosity of the imprint material 3 (a viscosity at 25° C.) is greater than or equal to 1 mPa·s and less than or equal to 100 mPa·s, for example.

[Configuration of Imprint Apparatus]

FIG. 1 is a schematic view for illustrating a configuration of the imprint apparatus 100 of the first embodiment. The imprint apparatus 100 can include an imprint head 10 that holds the mold 1, a stage 20 (a substrate stage) that is movable while holding the substrate 2, a deformation device 30, a supply device 40 (supplier), a curing device 50, a detector 60, and a controller 70, for example. The controller 70 is configured by a computer having a CPU, a memory (storage device), and the like, and controls each device (unit) of the imprint apparatus 100 to control an imprint process, for example.

The mold 1 is normally manufactured by a material such as quartz that can let ultraviolet light transmit therethrough, and a concave-convex pattern to be transferred to the imprint material 3 on the substrate is formed on an area (a pattern region 1a) on a portion of a surface (a pattern surface) on a substrate side. In addition, a cavity 1b (a concave portion) is formed on the mold 1 on a surface opposite of the pattern surface so that the thickness of the pattern region and a periphery thereof become thinner to make it easier to deform the mold 1 (the pattern region 1a) into a convex shape where a central portion thereof is protruding toward the substrate 2. When the mold 1 is held by the imprint head 10, the cavity 1b becomes a substantially hermetically sealed space. The cavity 1b is joined (connected) to the deformation device 30 which is described later via a pipe 31.

The imprint head 10 can include a mold chuck 11 and a mold driving device 12 (a driver), for example. The mold chuck 11 holds the mold 1 by vacuum chuck or the like. In addition, the mold driving device 12 includes a plurality of actuators 12a for generating respective forces in the direction of the arrow symbols A, for example, and drive the mold 1 (the mold chuck 11) so as to change an interval between the mold 1 and the substrate 2. In other words, it relatively drives the mold 1 and the substrate 2. In addition, the imprint head 10 is provided with a pressing device 13 for deforming the pattern region 1a by applying force to side surfaces of the mold 1 so as to decrease a shape difference between the pattern region 1a of the mold 1 and a shot region of the substrate 2 (an region to which the pattern of the mold 1 is to be transferred). The pressing device 13 can include a plurality of actuators for generating respective forces in the directions of the arrow symbols B, for example.

The stage 20 is configured to hold the substrate 2 by vacuum chuck or the like, and to be movable in XY directions, for example. The stage 20 of the present embodiment is configured to be movable in the XY directions so as to align the mold 1 and the substrate 2 in the XY directions, but it may have, for example, a function for driving the substrate 2 in the Z direction or a θ direction (a rotation direction around the Z-axis). Here, in the present embodiment, an operation for relatively driving the mold 1 and the substrate 2 to change the interval therebetween is performed by the imprint head 10. However, there is no limitation to this, and it may be performed by the stage 20, and may be performed by both of the imprint head 10 and the stage 20.

The deformation device 30 controls internal pressure of the cavity 1b of the mold 1 which is held by the imprint head 10, thereby deforming the mold 1 (the pattern surface, the pattern region 1a) to a convex shape where a central portion thereof is protruding toward the substrate 2. For example, the deformation device 30 can supply compressed air to inside of the cavity 1b via the pipe 31 and make internal pressure of the cavity 1b higher than external pressure, thereby deforming the mold 1 to a convex shape.

The supply device 40 supplies the imprint material 3 onto the substrate by an ink-jet method or the like. In the present embodiment, an ultraviolet curing resin having properties of curing in accordance with irradiation of ultraviolet light is used as the imprint material 3. In a state where the mold 1 and the imprint material 3 on the substrate are in contact, the curing device 50 (an irradiation device) irradiates the imprint material 3 on the substrate with light (for example, ultraviolet light) via a beam splitter 51 and the mold 1, thereby curing the imprint material 3.

The detector 60 irradiates the substrate 2 with a light 61 via the mold 1, and detects interference fringes formed by light reflected from the mold 1 and light reflected from the substrate 2. For example, the detector 60 includes an image capturing device such as an image sensor, and causes the image capturing device to capture the pattern region 1a of the mold 1 at each of a plurality of timings in a process for gradually increasing the contact area between the mold 1 and the imprint material 3.

Figure 2B:
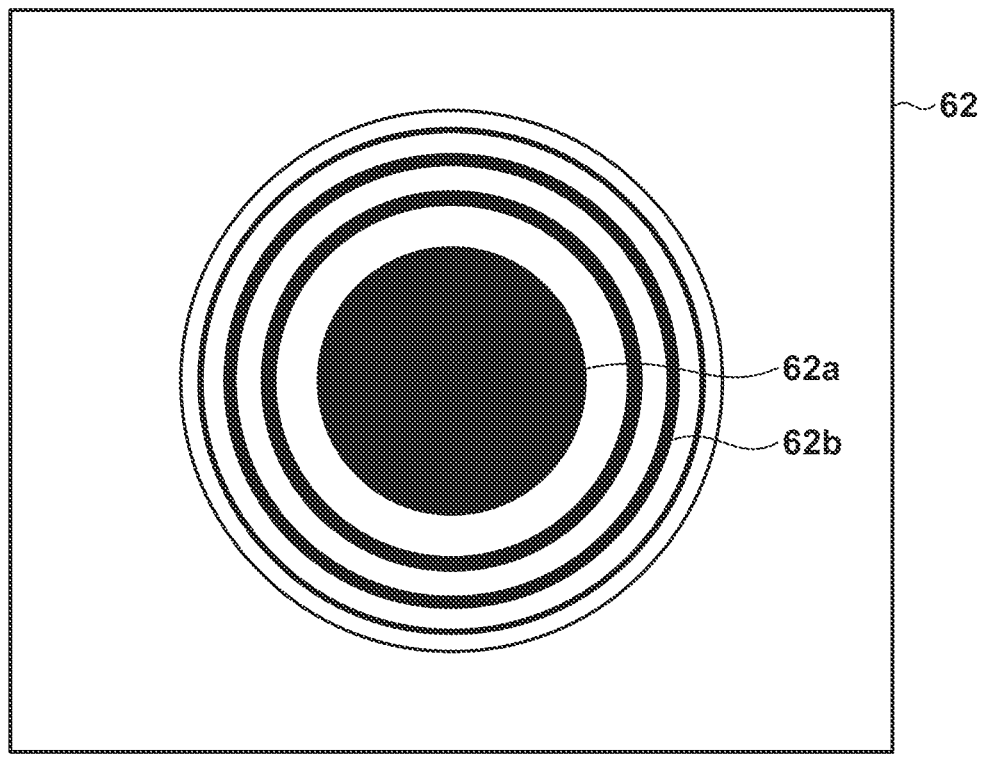

Specifically, in a state where the mold 1 deformed by the deformation device 30 is brought into contact with the imprint material 3 on the substrate 2, the detector 60 (an image capturing device) irradiates the light 61 on the substrate 2 via the mold 1. At this point, outside (around) the contact area, the reflected light 61a from the mold 1 and the reflected light 61b from the substrate 2 interfere with each other, as illustrated by FIG. 2A. As a result, a contact area 62a and interference fringes 62b formed outside of the contact area 62a appear in each image 62 obtained by the image capturing device, as illustrated by FIG. 2B. Accordingly, the detector 60 detects the contact area 62a and the interference fringes 62b outside of the contact area 62a from the images obtained by the image capturing device, and can observe the contact state between the mold 1 and the imprint material 3. Here, the detector 60 may be configured so as to irradiate the substrate 2 with a light 61 of a wavelength range that does not cure the imprint material 3 on the substrate. In addition, there are cases below where the "interference fringes" detected by the detector 60 is used as a term that includes the contact area 62a and the interference fringes 62b.

[Imprint Process]

Figure 3:
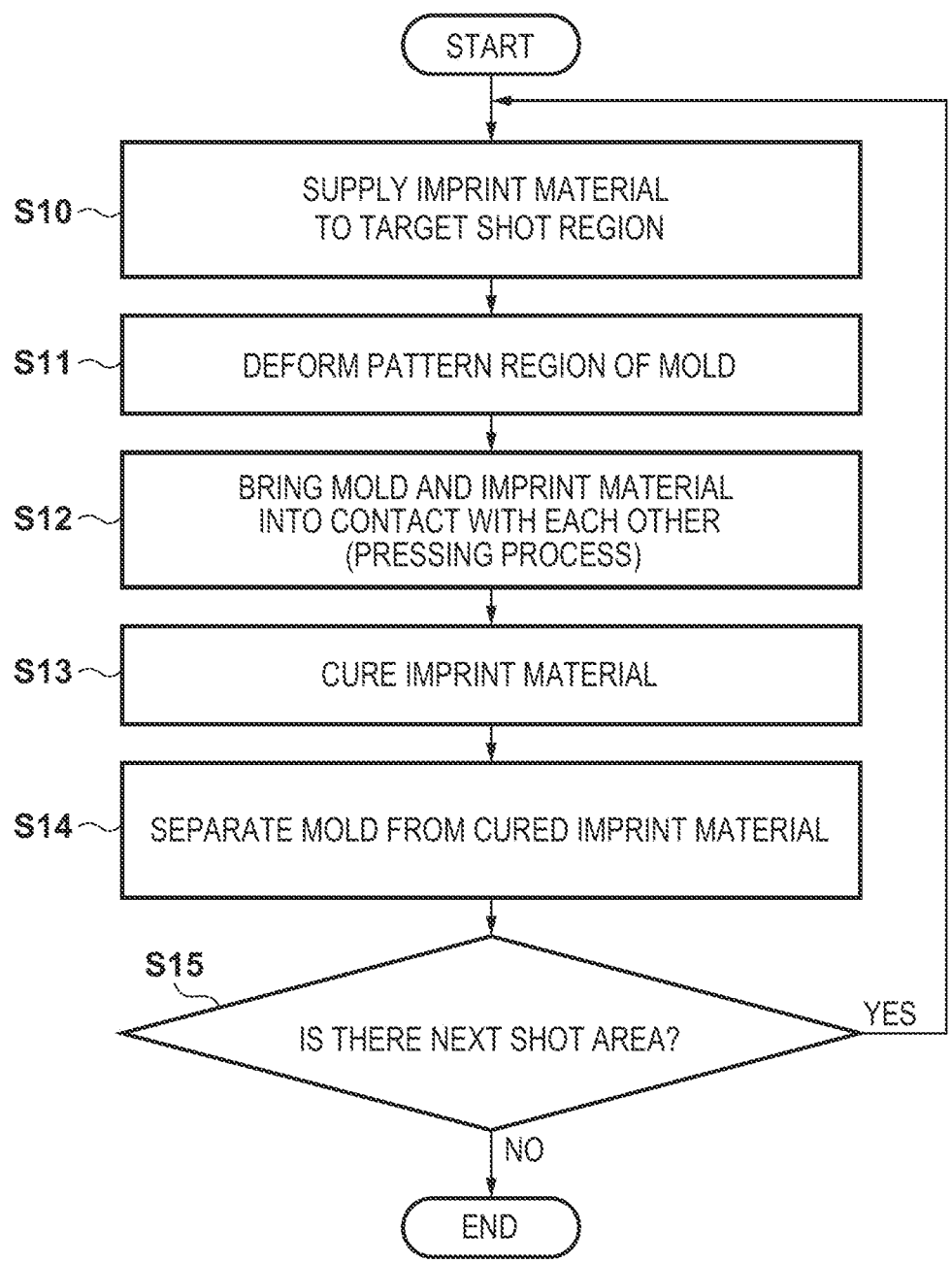
FIG. 3 is a flowchart for illustrating a flow of an imprint process.

Next, with reference to FIG. 3, description is given regarding an imprint process in the imprint apparatus 100 of the first embodiment. FIG. 3 is a flowchart for illustrating a flow of an imprint process. Each process of the imprint process indicated below can be performed by the controller 70.

In step S10, the controller 70 controls the stage 20 so that the substrate 2 is arranged below the supply device 40. The supply device 40 is controlled so as to supply the imprint material 3 to a shot region in which the imprint process is to be performed (hereinafter, a target shot region) out of a plurality of shot regions formed on the substrate. After the imprint material is supplied to the target shot region, the controller 70 controls the stage 20 so that the target shot region is arranged under the mold 1 (the pattern region 1*a*).

In step S11, the controller 70 controls the deformation device 30 so as to deform the pattern surface (the pattern region 1*a*) of the mold 1 to a convex shape where a central portion protrudes toward the substrate 2. In step S12, the controller 70 controls the imprint head 10 to decrease the interval between the mold 1 and the substrate 2, and brings the mold 1 and the imprint material 3 on the substrate in contact with each other (a pressing process). For example, the controller 70 starts contact between the mold 1 and the imprint material 3 in a state where the pattern surface of the mold 1 is deformed by the deformation device 30. After contact between the mold 1 and the imprint material 3 has started, the deformation device 30 is controlled so that internal pressure of the cavity 1*b* gradually decreases as decreasing the interval between the mold 1 and the substrate 2. Consequently, it is possible to gradually increase the contact area between the mold 1 and the imprint material 3, and it is also possible to make the pattern region 1*a* planar when the entirety of the pattern region 1*a* of the mold 1 is in contact with the imprint material 3. In addition, at each of a plurality of arbitrary timings during the pressing process, the controller 70 causes the detector 60 to capture an image of the pattern surface (the pattern region 1*a*) of the mold 1 and causes the detection device 60 to detect the contact area 62*a* and the interference fringes 62*b* from the images obtained thereby.

In step S13, in a state where the entirety of the pattern region 1*a* of the mold 1 is in contact with the imprint material 3, the controller 70 controls the curing device 50 so as to irradiate the imprint material 3 with light to cure the imprint material 3. In step S14, the controller 70 controls the imprint head 10 so as to increase the interval between the mold 1 and the substrate 2, thereby separating (releasing) the mold 1 from the cured imprint material 3. As a result, it is possible to form a pattern of a three-dimensional shape conforming to the pattern of the mold 1 on the imprint material 3 on the target shot region.

In step S15, the controller 70 determines whether there is a shot region (a subsequent shot region) to next transfer the pattern of the mold 1 to on the substrate. If there is a subsequent shot region the process returns to step S10, and if there is no subsequent shot region the process ends.

[Control of the Pressing Process]

In the imprint apparatus, typically the contact state when the contact area between the mold 1 and the imprint material 3 on the substrate in the pressing process is increasing can provide an influence on the quality of the formed pattern of the imprint material 3 which is on the substrate. As the contact state, a direction in which the mold 1 and the imprint material 3 are brought into contact with each other (in other words, a pressing direction between the mold 1 and the imprint material 3), and a relative tilt between the mold 1 and the substrate 2 when the mold 1 and the imprint material 3 are brought into contact with each other can be given. For example, when the mold 1 and the imprint material 3 are brought into contact with each other in a state where the mold 1 and the substrate 2 are relatively tilted, the pattern region 1*a* and the substrate 2 will not become parallel when the entirety of the pattern region 1*a* is brought into contact with the imprint material 3. As a result, for example a residual layer thickness (RLT) of the pattern of the imprint material 3 formed on the substrate becomes non-uniform, and it is difficult to accurately form the pattern of the mold 1 on the substrate. In addition, in a case where a pressing direction for the mold 1 and the imprint material 3 deviates from a target direction (for example, a direction orthogonal to the surface of the substrate), the pattern of the mold 1 will distort during the pressing process due to the viscosity of the imprint material 3. As a result, it can be difficult to accurately form the pattern of the mold 1 on the substrate.

Accordingly, with the imprint apparatus 100 of the present embodiment, the contact state in the pressing process is controlled based on the interference fringes 62*b* and the contact area 62*a* detected by the detector 60. Specifically, the controller 70 obtains a contact angle and a center position of the contact area from the images (the contact area 62*a* and the interference fringes 62*b*) obtained by the detector 60. In addition with correcting (controlling) the relative tilt between the mold 1 and the substrate 2 based on the obtained center position, the pressing direction between the mold 1 and the imprint material 3 is corrected (controlled) based on the obtained contact angle. Here, the contact angle is an angle formed between the substrate 2 and the mold 1 outside of the contact area.

Figure 4A:
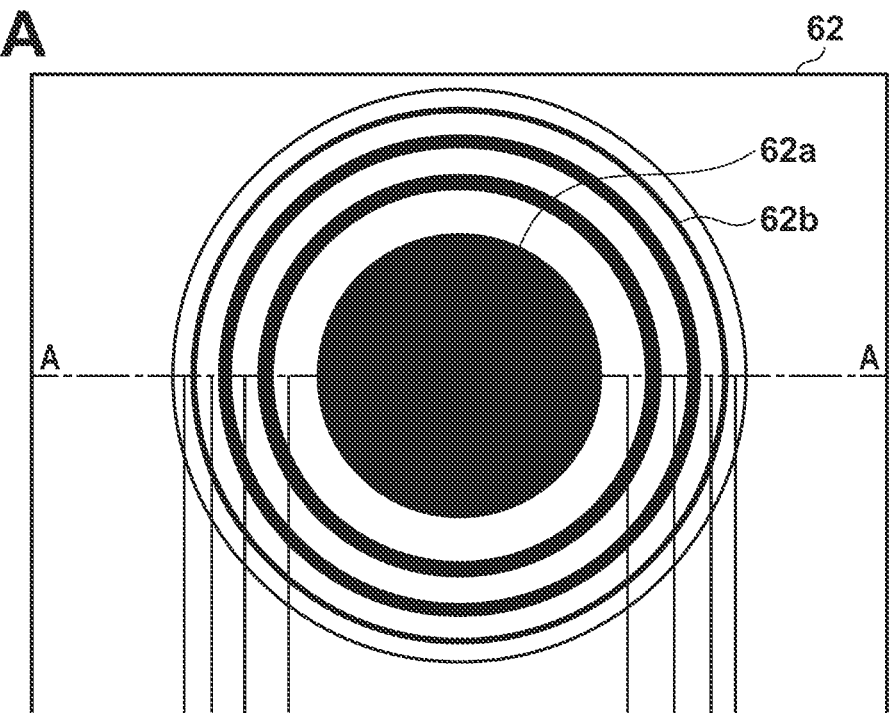
FIGS. 4A to 4C are views for describing estimation of a cross-sectional shape of a mold.
Figure 4B:
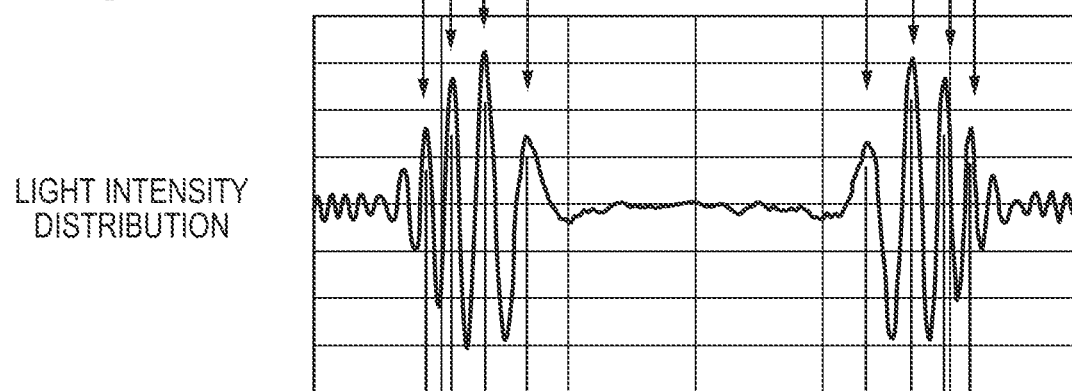
Figure 4C:
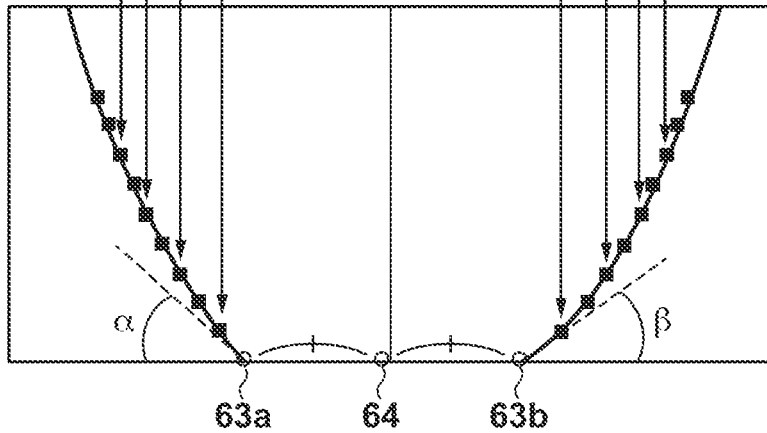

Firstly, with reference to FIGS. 4A through 4C, description is given regarding a method for obtaining the contact angle and the center position of the contact area from an image obtained by the detector 60. FIG. 4A illustrates an image 62 (the contact area 62*a* and the interference fringes 62*b*) obtained by the detector 60 (an image capturing device), and FIG. 4B illustrates a light intensity distribution on a line A-A of the image illustrated by FIG. 4A.

From the theory of interference, the plurality of peaks for light intensity in the interference fringes 62*b* appear at positions where the distance between the mold 1 and the substrate 2 is an integer multiple of ¼ of the wavelength of the light used in the detection of the interference fringes 62*b* (capturing of the contact area). Accordingly, the controller 70 can estimate the cross-sectional shape of the mold 1, as illustrated by FIG. 4C, by converting each of the plurality of peaks in the light intensity distribution illustrated by FIG. 4B to a distance between the mold 1 and the substrate 2, and drawing lines of approximation. Consequently, the controller 70 can obtain, from the estimated cross-sectional shape of the mold 1, two boundaries 63*a* and 63*b* on lines that pass through (cross) the contact area 62*a* in a predetermined direction (a first direction (for example, the X direction)).

The controller 70 then estimates a center of the two boundaries 63*a* and 63*b* for which the interval in the predetermined direction (in other words, the width of the contact area 62*a*) is largest as a center position 64 of the contact area 62*a*. A contact angle is then estimated for each of the two boundaries 63*a* and 63*b*. For example, the controller 70 obtains, as the contact angle, an angle formed between the surface of the substrate 2 and the mold 1 (the pattern surface, the pattern region 1*a*) when each of the two boundaries 63*a* and 63*b* is taken as a vertex. In addition, the positions of the boundaries 63*a* and 63*b* and the position of the interference fringes 62*b* may be used to obtain the tilt of the mold 1 outside of the contact area, and set the obtained tilt as the contact angle. Below, the contact angle when the boundary 63*a* is taken as a vertex is represented as a "first contact angle α", and the contact angle when the boundary 63b is taken as a vertex is represented as a "second contact angle β". In addition, description is given regarding the first direction below, but similar processing can be performed for a second direction (for example, the Y direction) orthogonal to the first direction.

Figure 5A:
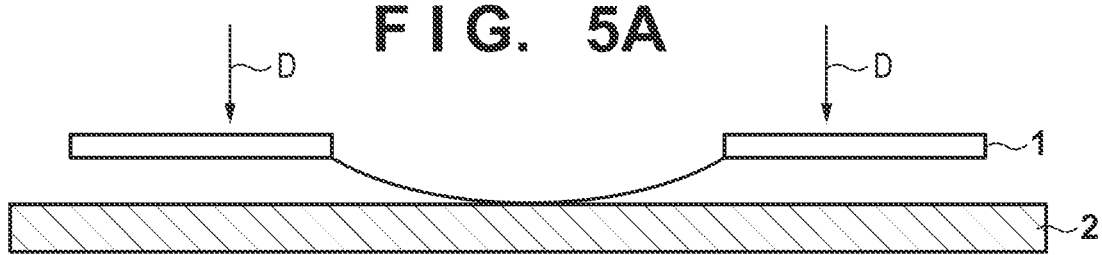
FIGS. 5A to 5E are views for describing a contact state between an imprint material on a substrate and a mold, in a pressing process.
Figure 5B:
Figure 5C:
Figure 5D:
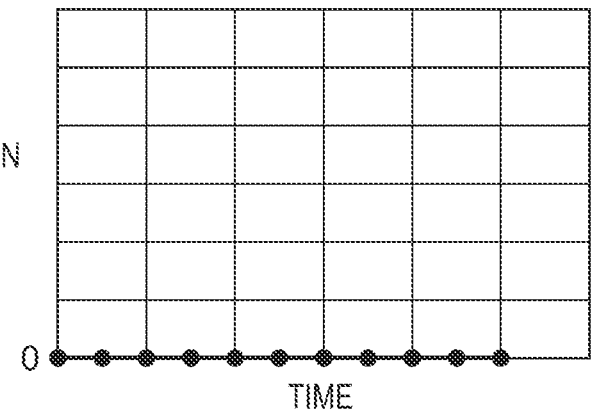
Figure 5E:
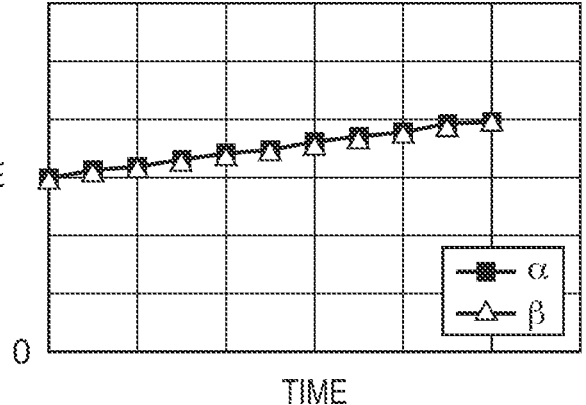

FIGS. 5A through 5E are views for describing an ideal contact state between the imprint material 3 on a substrate and the mold 1, in a pressing process. An ideal contact state refers to the state where the mold 1 and the substrate 2 are parallel, and a pressing direction D between the mold 1 and the imprint material 3 is a direction orthogonal to the surface of the substrate 2, for example. FIGS. 5A through 5C illustrate a situation where the interval between the mold 1 and the substrate 2 (the imprint material 3) narrows. FIG. 5D illustrates temporal change of a difference (center position deviation) between the center position of the contact area 62a obtained from the image 62 which is obtained by the detector 60, and the target position on the substrate where the center position should be arranged. In addition, FIG. 5E illustrates temporal change of the first contact angle α and the second contact angle β which are obtained from the image 62 obtained by the detector 60. In FIGS. 5D and 5E, the abscissa is time that has elapsed since contact between the mold 1 and the imprint material 3 on the substrate started, but it can represent the interval between the mold 1 and the substrate 2. In the ideal contact state, the difference between the target position and the center position of the contact area 62a is approximately zero as illustrated by FIG. 5D, and does not change even as time elapses (in other words, even if the interval between the mold 1 and the substrate 2 narrows). In addition, the first contact angle α and the second contact angle β are approximately the same even as time elapses, as illustrated by FIG. 5E.

FIGS. 6A through 6E are views for illustrating states where the mold 1 and the substrate 2 are relatively tilted in contrast to the ideal contact state illustrated by FIGS. 5A through 5E. FIGS. 6A through 6C illustrates a situation where the interval between the mold 1 and the substrate 2 (the imprint material 3) narrows, in a state where the relative tilt between the mold 1 and the substrate 2 is deviating from an ideal state. FIG. 6D illustrates temporal change of a difference (center position deviation) between the center position of the contact area 62a obtained from the image 62 which is obtained by the detector 60, and the target position on the substrate. In addition, FIG. 6E illustrates temporal change of the first contact angle α and the second contact angle β which are obtained from the image 62 obtained by the detector 60. In the case where the relative tilt between the mold 1 and the substrate 2 is deviated with respect to the ideal state (a target relative tilt), as illustrated by FIG. 6D, the difference between the target position and the center of the contact area 62a does not become zero. Meanwhile, the first contact angle α and the second contact angle β are, as illustrated by FIG. 6E, approximately equal even as time elapses (in other words, even if the interval between the mold 1 and the substrate 2 narrows).

In such a case, the controller 70, based on the difference between the target position on the substrate and the center position of the contact area 62a obtained from the image 62, obtains an error regarding the relative tilt between the mold 1 and the substrate 2 (for example, a deviation amount (second error) of the relative tilt between the mold 1 and the substrate 2 with respect to the ideal state). Based on the obtained error for the relative tilt, the controller 70 corrects the relative tilt between the mold 1 and the substrate 2 so as to reduce the error. Correction of the relative tilt between the mold 1 and the substrate 2, for example, may be performed by tilting the mold 1 in accordance with the plurality of actuators 12a in the mold driving 12, may be performed by tilting the substrate 2 by the stage 20, and may be relatively performed by both of these. In other words, at least one of the mold driving 12 and the stage 20 can function as a changing device (a second changing device) for changing the relative tilt between the mold 1 and the substrate 2.

Here, for calculation (determination) of the error for the relative tilt, it is possible to use, for example, information (hereinafter, error information for the relative tilt) indicating the relationship between error for the relative tilt between the mold 1 and the substrate 2, and the difference between the target position and the center of the contact area 62a. The error information for the relative tilt is represented by a function, a table, or the like for example, and can be obtained in advance in accordance with an experiment, a simulation, or the like. For example, for each of a plurality of states where a relative tilt amount θ between the mold 1 and the substrate 2 is mutually different, the controller 70 brings the mold 1 and the imprint material 3 on the substrate into contact with each other, and causes the detector 60 to capture the pattern region 1a of the mold 1. Consequently, the controller 70 obtains the difference A between the target position and the center position of the contact area 62a from the image 62 obtained by the detector 60 in each of the plurality of states, and can obtain a function represented by A=Kθ (K is a coefficient) or the like as error information for the relative tilt.

Figure 7A:
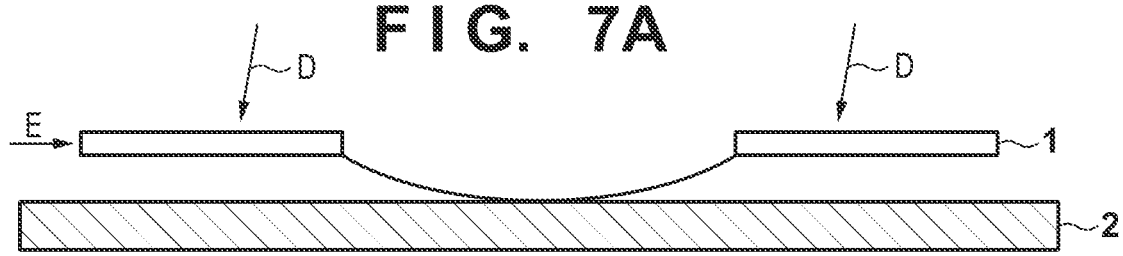
FIGS. 7A to 7E are views for describing a contact state between an imprint material on a substrate and a mold, in a pressing process.
Figure 7B:
Figure 7C:
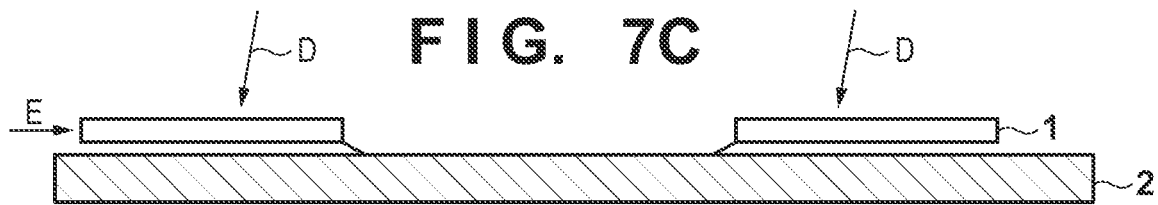
Figure 7D:
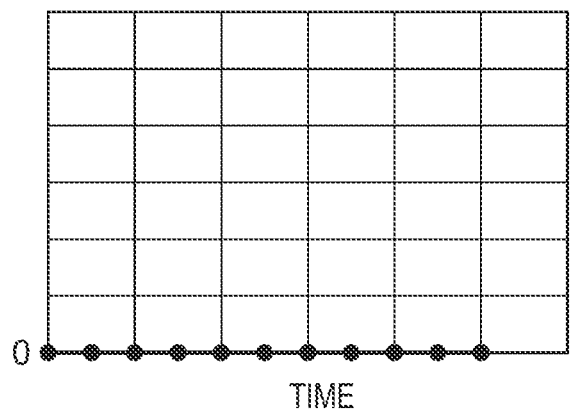
Figure 7E:
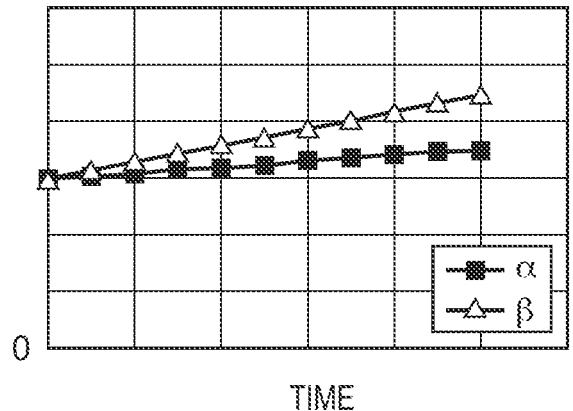

FIGS. 7A through 7E are views for illustrating states where a pressing direction D for the mold 1 and the imprint material 3 is tilted in contrast to the ideal contact state illustrated by FIGS. 5A through 5E. FIGS. 7A through 7C illustrates a situation where the interval between the mold 1 and the substrate 2 (the imprint material 3) narrows, in a state where the pressing direction D is deviating from an ideal state. FIG. 7D illustrates temporal change of a difference (center position deviation) between the center position of the contact area 62a obtained from the image 62 which is obtained by the detector 60, and the target position on the substrate. In addition, FIG. 7E illustrates temporal change of the first contact angle α and the second contact angle β which are obtained from the image 62 obtained by the detector 60. In a case where the pressing direction deviates from the ideal state, as illustrated by FIG. 7D, the center position deviation is approximately zero and does not change even as time passes (in other words, even when the interval between the mold 1 and the substrate 2 narrows). Meanwhile, as illustrated by FIG. 7E, a difference occurs between the first contact angle α and the second contact angle β, and this difference increases as time passes.

In such a case, the controller 70, based on the difference between the first contact angle α and the second contact angle β obtained from the image 62, obtains the error for the pressing direction D (for example, a deviation amount for the pressing direction of the mold 1 with respect to the ideal state). Based on the obtained error for the pressing direction D, the controller 70 corrects the pressing direction between the mold 1 and the imprint material 3 so as to reduce the error. Correction of the pressing direction may be performed by, for example, providing a changing device 14 for changing the tilt of the imprint head 10 (the mold driving 12) itself, and controlling the changing device 14 to change the driving direction of the mold 1 in accordance with the mold driving 12. In addition, correction of the pressing direction may be performed by adjusting, out of forces that press the mold 1 and the imprint material 3 against each other, a force E applied to a side surface of the mold 1 by the pressing device 13, during the pressing process, so that a direction component orthogonal to the surface of the substrate is corrected (reduced).

Here, for the calculation (determination) of the error for the pressing direction, for example, information (hereinafter, error information for the pressing direction) indicating the relationship between the difference the first contact angle α and the second contact angle β, and the error for the pressing direction between the mold 1 and the imprint material 3 can be used. The error information for the pressing direction is represented by a function, a table, or the like for example, and can be obtained in advance in accordance with an experiment, a simulation, or the like. For example, for each of a plurality of states where a pressing direction φ for the mold 1 is different therebetween, the controller 70 brings the mold 1 and the imprint material 3 on the substrate into contact with each other, and causes the detector 60 to capture the pattern region 1*a* of the mold 1. Consequently, the controller 70 obtains a difference B between the first contact angle α and the second contact angle β from the image 62 obtained by the detector 60 in each of the plurality of states, and can obtain a function represented by B=Mφ (M is a coefficient) or the like as error information for the pressing direction.

FIGS. 8A through 8E are views for illustrating states, with respect to the ideal contact states illustrated in FIGS. 5A through 5E, where the mold 1 and the substrate 2 are relatively tilted, and the pressing direction D between the mold 1 and the imprint material 3 is also tilted. FIGS. 8A through 8C illustrates a situation where the interval between the mold 1 and the substrate 2 (the imprint material 3) narrows, in a state where the relative tilt between the mold 1 and the substrate 2 and the pressing direction D are deviating from an ideal state. FIG. 8D illustrates temporal change of a difference (center position deviation) between the center position of the contact area 62*a* obtained from the image 62 which is obtained by the detector 60, and the target position on the substrate. In addition, FIG. 8E illustrates temporal change of the first contact angle α and the second contact angle β which are obtained from the image 62 obtained by the detector 60. In such a case, the correction of the relative tilt between the mold 1 and the substrate 2 described above using FIGS. 6A through 6E, and the correction of the pressing direction described above using FIGS. 7A through 7E can be performed.

As described above, the imprint apparatus 100 of the present embodiment corrects the relative tilt between the mold 1 and the substrate 2 and the pressing direction in the pressing process, based on the interference fringes 62*b* and the contact area 62*a* detected by the detector 60. Consequently, it is possible to form (transfer) the pattern of the mold 1 on the substrate with good accuracy.

Here, in the present embodiment, description was given for an example where information (FIG. 5D, FIG. 6D FIG. 7D, and FIG. 8D) indicating temporal change of the difference between the target position and the center position of the contact area is obtained, and the relative tilt between the mold 1 and the substrate 2 is corrected when the imprint process is performed next. However, there is no limitation to this, and for example configuration may be taken such that, when a difference between the target position and the center position of the contact area occurs during an imprint process for the target shot region (during a pressing process), the relative tilt between the mold 1 and the substrate 2 is sequentially corrected based on the difference.

Similarly, in the present embodiment, description was given for an example where information (FIG. 5E, FIG. 6E, FIG. 7E, and FIG. 8E) indicating temporal change of the difference between the first contact angle α and the second contact angle β is obtained, and the pressing direction between the mold 1 and the imprint material 3 is corrected when the imprint process is performed next. However, there is no limitation to this, and for example configuration may be taken such that, when a difference between the first contact angle α and the second contact angle β occurs during an imprint process for the target shot region (during a pressing process), the pressing direction between the mold 1 and the imprint material 3 is sequentially corrected based on the difference.

In addition, in the present embodiment, although the error for the relative tilt is first obtained based on the difference between the first contact angle α and the second contact angle β, and the pressing direction between the mold 1 and the imprint material 3 is corrected so as to reduce the error, there is no limitation to this. For example, the pressing direction between the mold 1 and the imprint material 3 may be corrected so as to reduce the difference between the first contact angle α and the second contact angle β.

<Embodiment of Method of Manufacturing Article>

A method of manufacturing an article according to an embodiment of the present invention is suitable to manufacturing an article such as an element having a microstructure or micro-device such as a semiconductor device, for example. The method of manufacturing an article of the present embodiment includes a step for using the foregoing imprint apparatus (imprint method) to form a pattern on an imprint material supplied (applied) to a substrate, and a step for processing the substrate on which the pattern was formed in the corresponding step. Furthermore, the corresponding manufacturing method includes other well-known steps (such as oxidation, film formation, vapor deposition, doping, planarization, etching, resist stripping, dicing, bonding, and packaging). The method of manufacturing an article of the present embodiment is advantageous in at least one of capabilities, quality, productivity, and manufacturing cost for the article in comparison to a conventional method.

A pattern of a cured material formed by using an imprint apparatus is used permanently for at least some of various articles, or is used temporarily when manufacturing various articles. An article is an electric circuit element, an optical element, a MEMS, a recording element, a sensor, a mold, or the like. As an electric circuit element, a volatile or non-volatile semiconductor memory such as a DRAM, an SRAM, a flash memory, and an MRAM, a semiconductor element such as an LSI, a CCD, an image sensor, and an FPGA, or the like may be given. The mold may be, for example, a mold for imprinting.

The pattern of a cured material is used unchanged as a constituent member for at least some of the foregoing articles, or is temporarily used as a resist mask. The resist mask is removed after etching, ion implantation, or the like is performed in processing steps for a substrate.

Next, description is given regarding a detailed method of manufacturing an article. As indicated by reference numeral 91 of FIG. 9, a substrate 1*z* such as a silicon wafer where a processed material 2*z* such as an insulator is formed on a surface thereof is prepared, and next an imprint material 3*z* is applied to the surface of the processed material 2*z* by an ink-jet method or the like. Here, a situation where the imprint material 3*z* in a plurality of droplet shapes has been applied onto the substrate is illustrated.

As illustrated by reference numeral 92 of FIG. 9, a mold 4z for imprinting is oriented so that a side thereof where a concave-convex pattern is formed is caused to face toward the imprint material 3z on the substrate. As illustrated by reference numeral 93 of FIG. 9, the substrate 1z to which the imprint material 3z has been applied and the mold 4z are caused to be in contact, and pressure is applied. The imprint material 3z is filled into the spaces between the mold 4z and the processed material 2z. When light as energy for curing irradiates through the mold 4z in this state, the imprint material 3z is cured.

As indicated by reference numeral 94 of FIG. 9, when the mold 4z and the substrate 1z are separated after the imprint material 3z is cured, a pattern of the cured material of the imprint material 3z is formed on the substrate 1z. The pattern of this cured material has a shape where a concave portion of the mold corresponds to a convex portion of the cured material and a convex portion of the mold corresponds to a concave portion of the cured material, in other words the concave-convex pattern of the mold 4z has been transferred to the imprint material 3z.

As illustrated by reference numeral 95 of FIG. 9, when the pattern of the cured material is etched as an etching resistant mask, portions out of the surface of the processed material 2z where the cured material is not presented or thinly remains are removed, and grooves 5z are achieved. As illustrated by reference numeral 96 of FIG. 9, when the pattern of the cured material is removed, it is possible to achieve an article in which the grooves 5z are formed on the surface of the processed material 2z. The pattern of the cured material is removed here, but, for example, the pattern may be used as a film for insulation between layers included in a semiconductor element or the like without being removed after processing, in other words as a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-117887 filed on Jun. 15, 2017, which is hereby incorporated by reference herein in its entirety.

What is claimed is:

1. An imprint apparatus which forms a pattern of an imprint material on a substrate using a mold, the apparatus comprising:
    a deformation device configured to deform the mold to a convex shape where a central portion of the mold protrudes towards the substrate;
    a driver configured to relatively drive the mold and the substrate so as to bring the mold and the imprint material on the substrate into contact with each other;
    a detector configured to irradiate light onto the substrate through the mold, and detect interference fringes for light reflected from the mold and light reflected from the substrate; and
    a controller configured to control a pressing process for pressing the mold and the imprint material against each other so that a contact area between the mold and the imprint material on the substrate gradually increases, while controlling a deformation of the mold by the deforming device,
    wherein in the pressing process, the controller controls, by changing a relative driving direction between the mold and the substrate by the driver, a pressing direction in which the mold and the imprint material are pressed against each other, based on the interference fringes detected by the detector, so as to be a target pressing direction.

2. The imprint apparatus according to claim 1, further comprising a changing device configured to change a relative driving direction between the mold and the substrate by the driver.

3. The imprint apparatus according to claim 1, further comprising a pressing device configured to apply a force to a side surface of the mold,
    wherein the controller controls the pressing direction by adjusting the force applied to the side surface of the mold by the pressing device.

4. The imprint apparatus according to claim 1, wherein the controller controls the pressing direction based on an angle formed between the substrate and the mold outside of the contact area, the angle being obtained from the interference fringes detected by the detector.

5. The imprint apparatus according to claim 4, wherein the controller obtains the angle for each of two boundaries on a line that passes through the contact area, and controls the pressing direction based on a difference between the respective angles for the two boundaries.

6. The imprint apparatus according to claim 1, wherein in the pressing process, the controller controls a relative tilt between the substrate and the mold based on the interference fringes detected by the detector, so as to be a target relative tilt.

7. The imprint apparatus according to claim 6, further comprising a second changing device configured to change a relative tilt between the mold and the substrate,
    wherein the controller controls the relative tilt by controlling the second changing device.

8. The imprint apparatus according to claim 6, wherein the controller controls the relative tilt based on a center position of the contact area obtained from the interference fringes.

9. An imprint apparatus which forms a pattern of an imprint material on a substrate using a mold, the apparatus comprising:
- a deformation device configured to deform the mold to a convex shape where a central portion of the mold protrudes towards the substrate;
- a driver configured to relatively drive the mold and the substrate so as to bring the mold and the imprint material on the substrate into contact with each other;
- a detector configured to irradiate light onto the substrate through the mold, and detect interference fringes for light reflected from the mold and light reflected from the substrate; and
- a controller configured to control a pressing process for pressing the mold and the imprint material against each other so that a contact area between the mold and the imprint material on the substrate gradually increases, while controlling a deformation of the mold by the deforming device,
- wherein the controller, in the process for pressing,
    - obtains, based on the interference fringes detected by the detector, an angle formed between the substrate and the mold outside of the contact area for each of two boundaries on a line passing through the contact area, and
    - controls a pressing direction in which the mold and the imprint material are pressed against each other, based on the respective angles for the two boundaries, so as to be a target pressing direction.

10. A method of manufacturing an article, the method comprising:
- forming a pattern on a substrate using an imprint apparatus;
- processing the substrate, on which the pattern has been formed, to manufacture the article,
- wherein the imprint apparatus which forms a pattern of an imprint material on the substrate using a mold, and includes:
- a deformation device configured to deform the mold to a convex shape where a central portion of the mold protrudes towards the substrate;
- a driver configured to relatively drive the mold and the substrate so as to bring the mold and the imprint material on the substrate into contact with each other;
- a detector configured to irradiate light onto the substrate through the mold, and detect interference fringes for light reflected from the mold and light reflected from the substrate; and
- a controller configured to control a pressing process for pressing the mold and the imprint material against each other so that a contact area between the mold and the imprint material on the substrate gradually increases, while controlling a deformation of the mold by the deforming device,
- wherein, in the pressing process, the controller controls, by changing a relative driving direction between the mold and the substrate by the driver, a pressing direction in which the mold and the imprint material are pressed against each other, based on the interference fringes detected by the detector, so as to be a target pressing direction.

11. The imprint apparatus according to claim 1, wherein the target pressing direction is a direction orthogonal to a surface of the substrate.

12. The imprint apparatus according to claim 1, wherein in the pressing process, the controller controls the pressing direction, while controlling a relative tilt between the substrate and the mold, based on the interference fringes detected by the detector.

13. The imprint apparatus according to claim 1, wherein in the pressing process, the controller controls the pressing direction based on the interference fringes detected by the detector, while keeping a relative tilt between the substrate and the mold.

* * * * *